United States Patent
Li et al.

(10) Patent No.: US 10,429,416 B1
(45) Date of Patent: Oct. 1, 2019

(54) POWER SWITCHING DEVICE WITH INTEGRATED CURRENT SENSING TRANSFORMER

(71) Applicant: Bel Power Solutions Inc., Santa Clara, CA (US)

(72) Inventors: Jun Li, Shenzhen (CN); Ye Chen, Shenzhen (CN); Gordon Zongbo Hu, Sha Tin (CN); Mark A. Jutras, Upton, MA (US)

(73) Assignee: Bel Power Solutions Inc., Santa Clara, CA (US)

( * ) Notice: Subject to any disclaimer, the term of this patent is extended or adjusted under 35 U.S.C. 154(b) by 791 days.

(21) Appl. No.: 15/010,625

(22) Filed: Jan. 29, 2016

Related U.S. Application Data

(60) Provisional application No. 62/110,110, filed on Jan. 30, 2015.

(51) Int. Cl.
*G01R 15/18* (2006.01)
*H01F 27/29* (2006.01)
(Continued)

(52) U.S. Cl.
CPC ....... *G01R 15/181* (2013.01); *G01R 19/0092* (2013.01); *H01F 27/29* (2013.01); *H01F 38/20* (2013.01)

(58) Field of Classification Search
CPC ........ G01R 15/181–183; G01R 15/202; G01R 15/207; G01R 15/14; G01R 15/20;
(Continued)

(56) References Cited

U.S. PATENT DOCUMENTS

| 4,623,865 A | * | 11/1986 | Kiesel | .................. H01F 27/027 336/174 |
| 5,015,945 A | * | 5/1991 | Radun | .................. G01R 15/181 324/117 R |

(Continued)

FOREIGN PATENT DOCUMENTS

JP             H0244260         *    2/1990

*Primary Examiner* — Thang X Le
(74) *Attorney, Agent, or Firm* — Patterson Intellectual Property Law, P.C.; Gary L. Montle

(57) ABSTRACT

A power switching device is provided with an integrated current sensor. The device includes component housing and multiple terminal legs extending therefrom. A current sensor assembly includes an interior cavity having a galvanically insulating tubular sleeve extending therethrough. A toroidal inductive winding resides within the first cavity and is circumferentially disposed about the sleeve, with one leg of the device defining a (single-turn) primary winding and the winding defining a secondary winding magnetically coupled to the device leg. Current sensing terminals are associated with respective locations along the inductive winding, wherein a current through the encapsulated terminal leg is detectable via respective current sensing leads extending from the assembly housing. A damping inductive element such as a ferrite bead may be provided within a second interior cavity defined by the assembly housing to suppress high frequency oscillations associated with a second (e.g., gate) terminal leg of the switching device.

17 Claims, 7 Drawing Sheets

(51) Int. Cl.
*H01F 38/20* (2006.01)
*G01R 19/00* (2006.01)

(58) Field of Classification Search
CPC .... G01R 19/0092; G01R 13/02; G01R 21/08; G01R 11/32; G01R 33/18; G01R 33/02; H01F 27/29; H01F 38/20; H01L 41/12; H01L 41/16; H02K 41/06
See application file for complete search history.

(56) References Cited

U.S. PATENT DOCUMENTS

| | | | |
|---|---|---|---|
| 9,410,990 B2 * | 8/2016 | Singh | G01R 15/20 |
| 2012/0326711 A1 * | 12/2012 | Roper | G01N 27/025 |
| | | | 324/252 |
| 2013/0183043 A1 * | 7/2013 | Elberbaum | G01R 19/00 |
| | | | 398/115 |
| 2013/0207638 A1 * | 8/2013 | Gross | H01F 27/30 |
| | | | 323/358 |
| 2013/0278245 A1 * | 10/2013 | Loy | H01H 3/40 |
| | | | 324/137 |

* cited by examiner

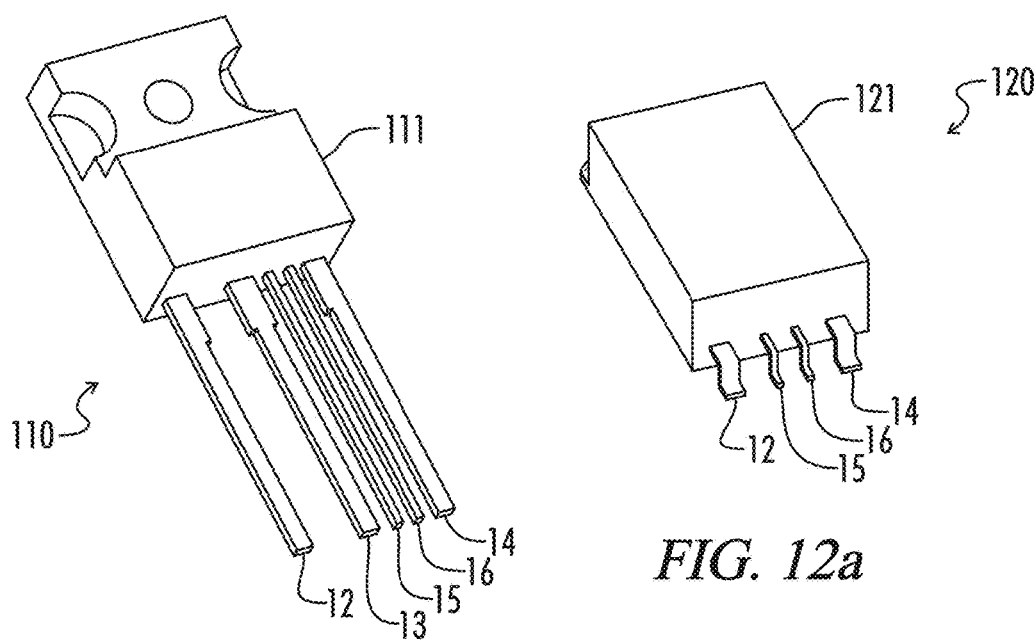
FIG. 11a
FIG. 12a
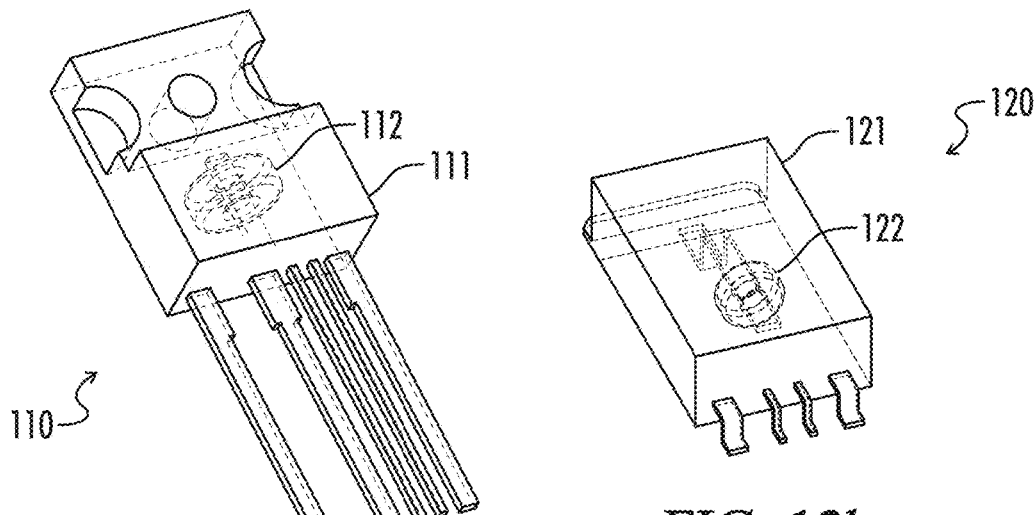
FIG. 11b
FIG. 12b

POWER SWITCHING DEVICE WITH INTEGRATED CURRENT SENSING TRANSFORMER

CROSS-REFERENCES TO RELATED APPLICATIONS

This application claims benefit of U.S. Provisional Patent Application No. 62/110,110, filed Jan. 30, 2015, and which is hereby incorporated by reference.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates generally to power switching devices. More particularly, the present invention relates to a current sensing solution for power switching devices which reduces power losses and parasitic inductance without correspondingly occupying excessive space in a power supply.

High efficiency is one of the important parameters in designs for modern power supplies, and power density has increased accordingly. A feedback (sensed) current signal is another important factor in proper operation of the power conversion circuit.

One conventional example is represented in FIG. 1 of a current sensing circuit 10 for a power conversion circuit implementing MOSFET devices 11 (having gate 12, drain 13 and source terminals 14), wherein the current signal is obtained from opposing ends 15, 16 of a current sensing resistor.

Another conventional example of a current sensing circuit 20 as represented in FIGS. 2a and 2b may include a discrete current sense transformer 21 having a primary winding coupled to the drain terminal of a MOSFET switching device 11 and a secondary winding to which current sensing leads 15, 16 are coupled.

One of skill in the art may appreciate that each of the two aforementioned examples contribute to additional losses due to the copper winding/track and soldering joint, and also introduction of parasitic inductance due to additional copper track. Such losses arise in the context of power switching devices implementing either fully controllable power switching (e.g., three terminal devices such as a MOSFET), or uncontrollable power switching (e.g., two terminal devices such as a power diode).

Yet another problem which arises in such conventional arrangements is undesirable occupation of physical space, particularly with respect to the discrete transformer, whether with respect, for example, to horizontal surface area on a printed circuit board or vertical cross-section in a stacked arrangement.

BRIEF SUMMARY OF THE INVENTION

A system as disclosed herein addresses the aforementioned problems by providing a power switching device having an integrated current sensing assembly. Briefly stated, such an integrated device may effectively eliminate the additional inductive winding required in conventional discrete current sensing transformers, as well as solder joint losses and accompanying parasitic inductance.

In an embodiment, a current sensing apparatus as disclosed herein includes an assembly housing defining at least a first interior cavity having a galvanically insulating tubular sleeve extending therethrough. A low profile toroidal inductive winding resides within the first cavity and is circumferentially disposed about the tubular sleeve, with first and second current sensing terminals being associated with respective locations along the inductive winding. In such a configuration, a current passing through a terminal leg from a power switching device extending through the tubular sleeve is thereby detectable via magnetic coupling with the inductive winding.

In one aspect of the described embodiment, the first and second current sensing terminals may be respectively coupled to first and second current sensing leads extending from the assembly housing. The first and second current sensing leads may be configured for through-hole coupling to a printed circuit board associated with the power switching device, or alternatively may be configured for surface-mount coupling.

In another aspect, a damping inductive element may be configured to suppress high frequency oscillations and may be disposed within a second interior cavity defined by the assembly housing. The damping inductive element may be a ferrite bead having an aperture configured to receive a second leg of the power switching device.

In another aspect, the first leg may be associated with a drain terminal or a source terminal of a MOSFET (or equivalent) power switching device, and the second leg may be associated with a gate terminal of the MOSFET power switching device. Alternatively, the first leg and the second leg may be respectively associated with either of the anode and cathode terminals of a power diode as the power switching device.

In an alternative embodiment, an integrated device as disclosed herein may include a power switching device housing and a plurality of terminal legs having an internal portion and an external portion extending from the housing. A low profile toroidal inductive winding resides within the device housing and is circumferentially disposed about an interior portion of one of the terminal legs. First and second current sensing terminals are associated with respective locations along the inductive winding, wherein a current through the one of the plurality of terminal legs is detectable via magnetic coupling with the inductive winding.

BRIEF DESCRIPTION OF THE SEVERAL VIEWS OF THE DRAWINGS

FIG. 3b is an exploded view of the assembly of FIG. 3a.

FIG. 3c is a top view of the assembly of FIG. 3a.

FIG. 4b is an exploded view of the assembly of FIG. 4a.

FIG. 5b is an exploded view of the assembly of FIG. 5a.

FIG. 6b is an exploded view of the assembly of FIG. 6a.

FIG. 7b is an exploded view of the assembly of FIG. 7a.

FIG. 8b is an exploded view of the assembly of FIG. 8a.

FIG. 9b is an exploded view of the assembly of FIG. 9a.

FIG. 10b is an exploded view of the assembly of FIG. 10a.

FIG. 11a represents an embodiment of a fully controllable and THT-type switching device having an embedded current sense transformer according to the present invention.

FIG. 11b represents a component view of the integrated device of FIG. 11a.

FIG. 12a represents an embodiment of a fully controllable and SMT-type switching device having an embedded current sense transformer according to the present invention.

FIG. 12b represents a component view of the integrated device of FIG. 12a.

FIG. 13b represents a component view of the integrated device of FIG. 13a.

FIG. 14b represents a component view of the integrated device of FIG. 14a.

DETAILED DESCRIPTION OF THE INVENTION

Figure 1:
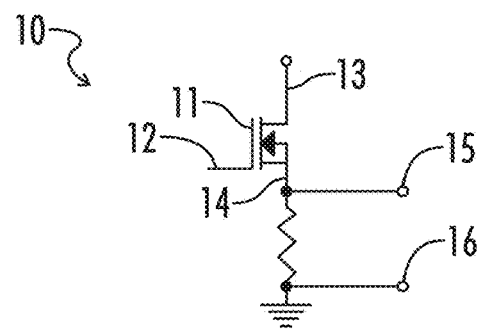
FIG. 1 is a schematic representing a conventional example of a current sense resistor arrangement.
Figure 2A:
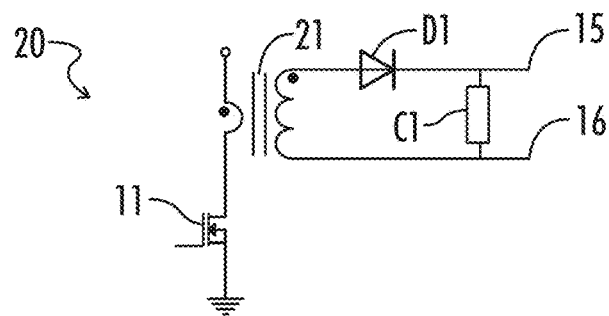
FIG. 2a is a schematic representing a conventional example of a current sense transformer.
Figure 2B:
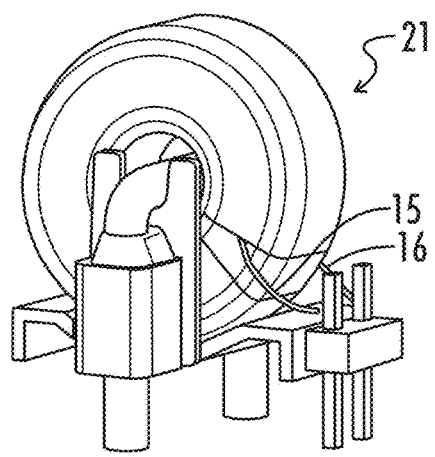
FIG. 2b is a perspective view of a conventional example of a discrete current sense transformer.

Referring generally to FIGS. 3a-14b, various embodiments of systems are described herein, wherein switching devices are provided having an integrated or embedded current sensing apparatus. Where the various figures may describe embodiments sharing various common elements and features with other embodiments, similar elements and features are given the same reference numerals and redundant description thereof may be omitted below.

Figure 3A:
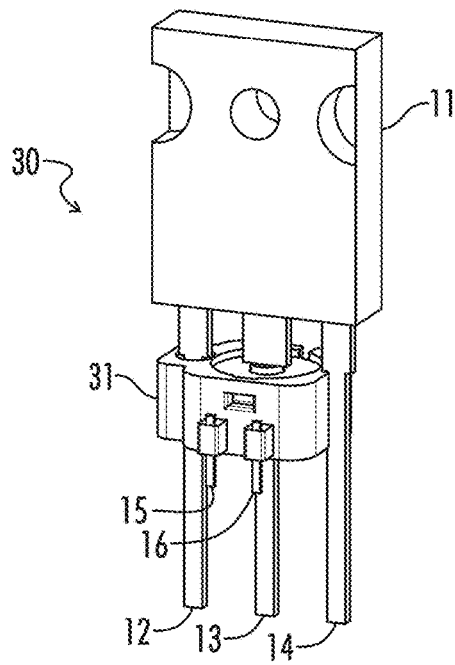
FIG. 3a is a perspective view of an integrated current sense transformer assembly (THT type) of the present invention, configured to engage the middle leg of a three-terminal switching device.
Figure 3B:
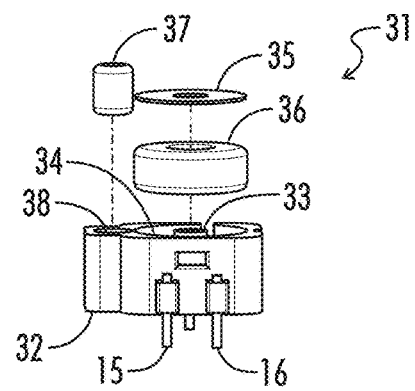
Figure 3C:
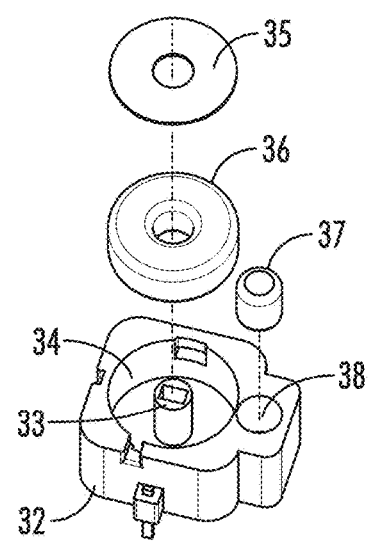

Referring first to a system 30 as represented in FIGS. 3a-3c, a power switching device 11 includes a switching component housing and a plurality of legs 12, 13, 14 extending therefrom. In an embodiment, the legs 12, 13, 14 correspond to the respective terminals of three-terminal power switching device such as a MOSFET. A current sensing assembly 31 in an embodiment as shown in FIG. 3b includes a unitary housing 32 with a cavity 34 and a tubular sleeve 33 defined therein. The housing 32 may in various embodiments be formed of an insulating material such as plastic. The tubular sleeve 33 has a defined aperture extending through the top and bottom of the housing 32 such that a leg of the switching device (in the example of FIG. 3a, the middle leg 13 associated with the drain terminal of a MOSFET switching device 11) can be received through the aperture. A low profile toroidal inductive winding 36 is provided into the cavity 34 wherein the inductive winding 36 defines a secondary winding magnetically coupled to the leg 13 of the switching device 11 when extended through the aperture. The switching device 11 and the assembly 31 are configured for through-hole ("TMT") coupling to a printed circuit board (not shown).

In various embodiments, the defined aperture associated with the sleeve may be configured with a shape in accordance with the switching device legs for which the housing is intended. In an example as shown, the aperture is defined with a rectangular cross section, but alternative shapes are within the scope of the present invention.

In the aforementioned embodiment, a primary winding (e.g., single turn) for a current sensing transformer assembly 31 is formed when the assembly housing 32 is sleeved over a leg of the power switching device 11 (e.g., corresponding to the drain or source lead of a MOSFET device). The additional primary winding and solder joints of more conventional current sensing transformer designs are thereby eliminated, and such a design further reduces the parasitic inductance which could be introduced by the additional primary winding.

In an embodiment, the toroid 36 is enclosed using a top cover 35 of an insulating material such as for example plastic. A bottom holder may also be provided for isolation purposes. Alternatively, either of a top or a bottom may be integrally formed with respect to the housing itself, wherein only one of the two is required separately in order to enclose and isolate the toroid disposed therein. In an embodiment, a top holder may be configured for a "snap-fit" attachment to one or more corresponding portions of the housing 32. In another embodiment, the top holder may be configured to be press-fit to the housing by an "upper" portion of the switch device leg which is passed through the aperture of the tubular sleeve 33, essentially defining one of a series of leg flanges which prevent the assembly 31 from sliding further upward along the legs of the device.

The housing 32 may further include a second cavity 38 configured to receive a damping element 37 such as, for example, a ferrite bead, which is further shaped to receive a second leg 12 of the switching device (e.g., associated with the gate terminal of a MOSFET device). The ferrite bead on the gate leg may be provided to dampen possible high frequency oscillations on the gate terminal as one of skill in the art would understand as arising due to parasitic capacitances from gate-to-drain and gate-to-source. When the switching device is operating, the gate-to-drain capacitance in particular needs to be charged and discharged rapidly. This may typically result in high peak gate currents, and further in conjunction with lead inductances (without damping) can result in oscillations on the gate terminal. The ferrite bead or equivalent element 37 as provided above may provide some high frequency, high impedance damping aspect for the purpose of avoiding or at least mitigating such oscillations.

In an embodiment as represented in FIGS. 3a-3c, the first and second cavities 34, 38 in housing 32 may define apertures for receiving or otherwise being sleeved over switching device legs such as, for example, a middle (drain) leg 13 and a first side (e.g., gate) leg 12. The housing 32 in this embodiment does not require a third cavity and/or aperture configured as a sleeve to receive a third, or second side (e.g., source) leg 14, although a notch or equivalent indentation in the housing may be required in order to facilitate appropriate engagement of the other two legs.

Figure 4A:
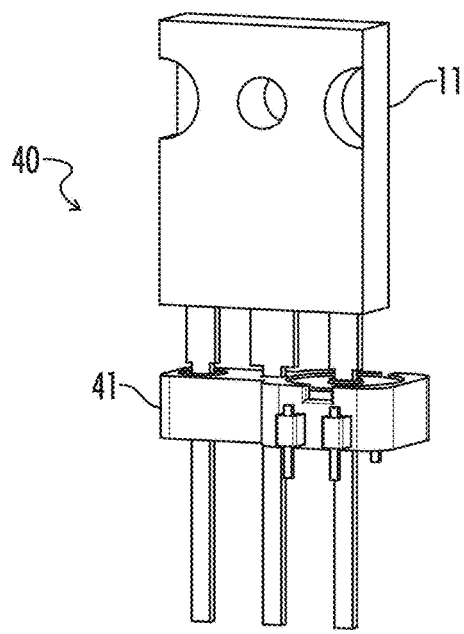
FIG. 4a is a perspective view of an integrated current sense transformer assembly (THT type) of the present invention, configured to engage the right leg of a three-terminal switching device.
Figure 4B:
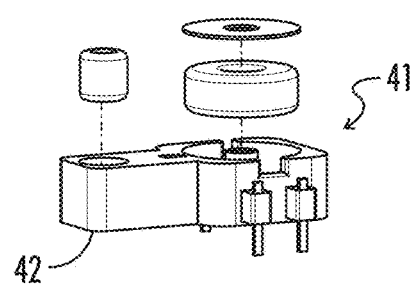

Referring next to FIGS. 4a and 4b, in another embodiment of a system 40 as disclosed herein a current sensing assembly 41 can include a housing 42 configured to be installed on the side legs rather than the middle leg. In the example shown, the first cavity 34 including the toroidal inductive winding 36 is provided with an aperture to receive one side (e.g., source) leg 14 and the second cavity 38 including the damping element (e.g., ferrite bead) 37 is provided with an aperture to receive the other side (e.g., gate) leg 12 of the switching device 11.

Figure 5A:
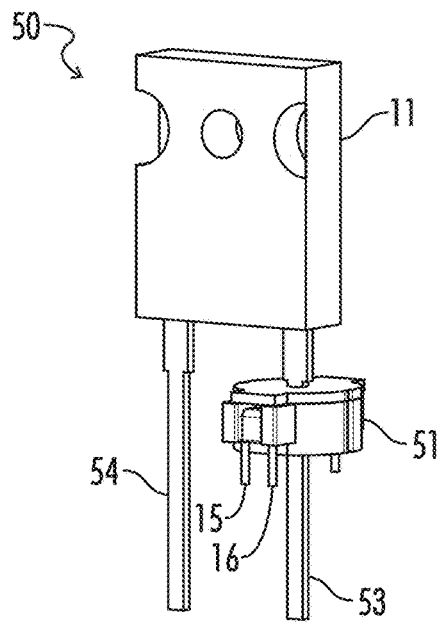
FIG. 5a is a perspective view of an integrated current sense transformer assembly (THT type) of the present invention, configured to engage the cathode leg of a two-terminal switching device.
Figure 5B:
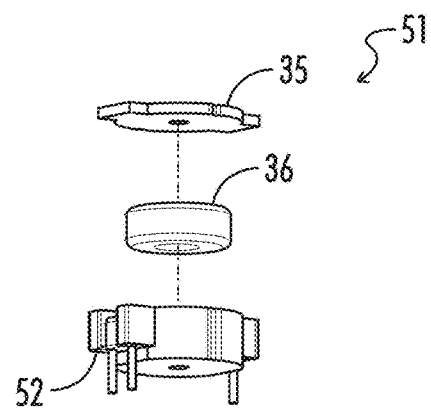

Referring next to FIGS. 5a and 5b, in another embodiment of a system 50 as disclosed herein a current sensing assembly 51 can include a housing 52 configured to be installed on one leg 53 (e.g., the cathode leg) for a two-terminal switching device 11 in a TMT configuration. In the example shown, the "first" cavity 34 as reference above for including the toroidal inductive winding 36 is provided with an aperture to receive the cathode leg 53, and the "second" cavity is not required.

Figure 6A:
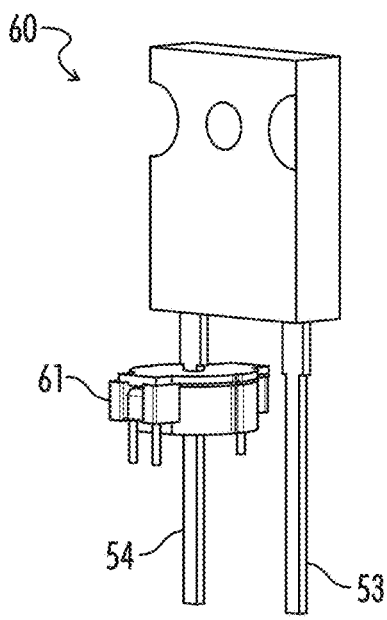
FIG. 6a is a perspective view of an integrated current sense transformer assembly (THT type) of the present invention, configured to engage the anode leg of a two-terminal switching device.
Figure 6B:
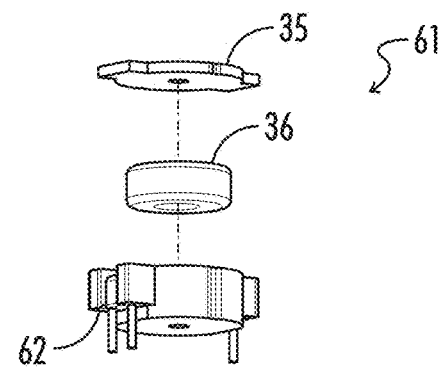

Referring next to FIGS. 6a and 6b, in another embodiment of a system 60 as disclosed herein a current sensing assembly 61 can include a housing 62 which is otherwise similar to that disclosed in FIGS. 5a and 5b, but configured to be installed on the other leg 54 (e.g., the anode leg) for a two-terminal switching device 11 in a TMT configuration.

Figure 7A:
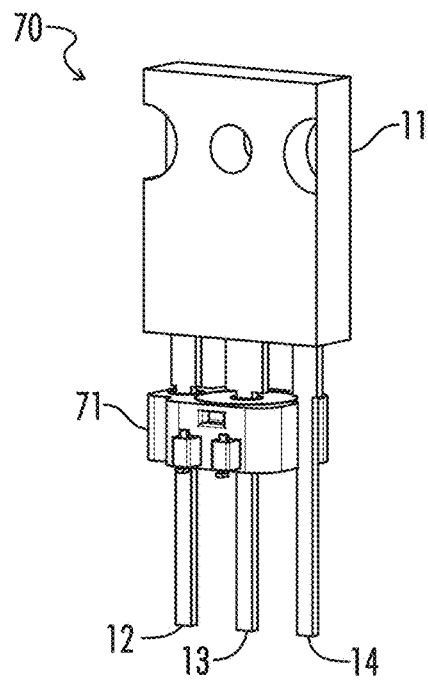
FIG. 7a is a perspective view of an integrated current sense transformer assembly (SMT type) of the present invention, configured to engage the middle leg of a three-terminal switching device.
Figure 7B:
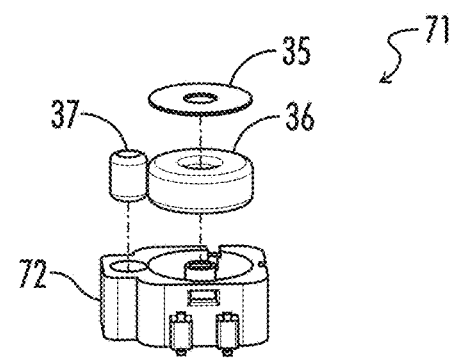

Referring next to FIGS. 7a and 7b, in another embodiment of a system 70 as disclosed herein a current sensing assembly 71 can include a housing 72 which is otherwise similar to that disclosed in FIGS. 3a-3c, but configured to be installed on a three-terminal switching device 11 in a surface mount ("SMT") configuration.

Figure 8A:
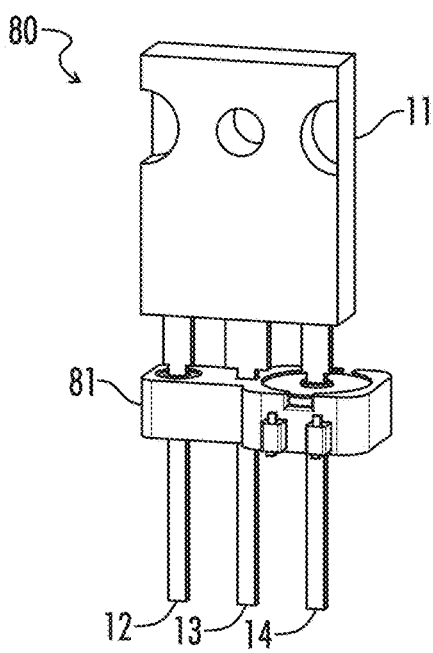
FIG. 8a is a perspective view of an integrated current sense transformer assembly (SMT type) of the present invention, configured to engage the right leg of a three-terminal switching device.
Figure 8B:
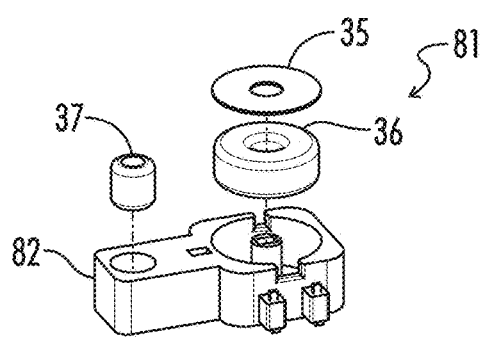

Referring next to FIGS. 8a and 8b, in another embodiment of a system 80 as disclosed herein a current sensing assembly 81 can include a housing 82 which is otherwise similar to that disclosed in FIGS. 4a and 4b, but configured to be installed on a three-terminal switching device 11 in a surface mount ("SMT") configuration.

Figure 9A:
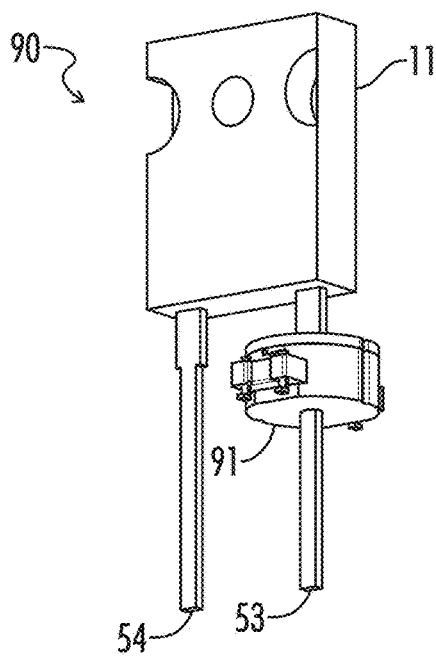
FIG. 9a is a perspective view of an integrated current sense transformer assembly (SMT type) of the present invention, configured to engage the cathode leg of a two-terminal switching device.
Figure 9B:
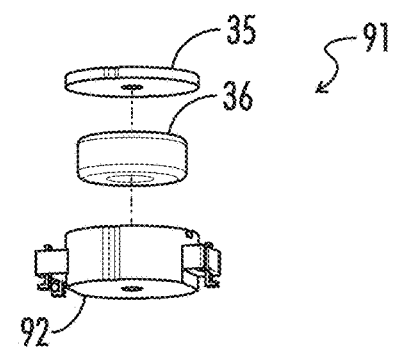

Referring next to FIGS. 9a and 9b, in another embodiment of a system 90 as disclosed herein a current sensing assembly 91 can include a housing 92 which is otherwise similar to that disclosed in FIGS. 5a and 5b, but configured to be installed on a two-terminal switching device 11 in a surface mount ("SMT") configuration.

Figure 10A:
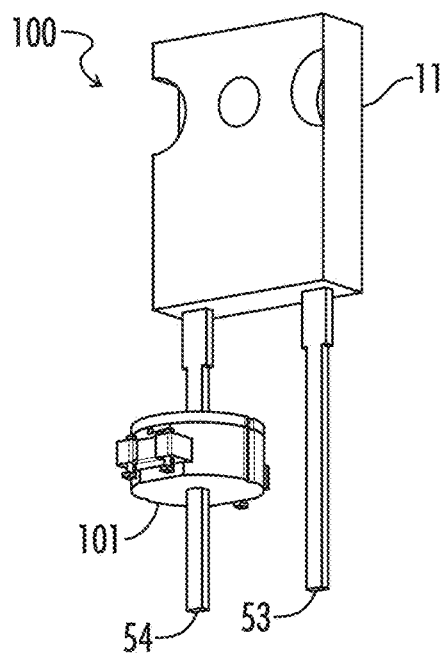
FIG. 10a is a perspective view of an integrated current sense transformer assembly (SMT type) of the present invention, configured to engage the anode leg of a two-terminal switching device.
Figure 10B:
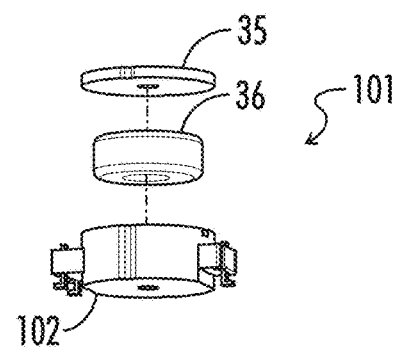

Referring next to FIGS. 10a and 10b, in another embodiment of a system 100 as disclosed herein a current sensing assembly 101 can include a housing 102 which is otherwise similar to that disclosed in FIGS. 6a and 6b, but configured to be installed on a two-terminal switching device 11 in a surface mount ("SMT") configuration.

With reference now to FIGS. 11a and 11b, in another embodiment of a system 110 as disclosed herein a current sensing assembly may include a current sense transformer embedded within a fully controlled power switching device 111. A toroidal inductive winding 112 is disposed for magnetic coupling, but nonetheless in galvanic isolation, with respect to one of the legs 12, 13 or 14 for the three-terminal device 111. First and second current sensing leads from the winding 112 are electrically coupled to respective legs 15, 16 which extend from the switching device housing in a THT configuration. This eliminates the additional solder joint, and reduces the parasitic inductance which would have otherwise been introduced.

With reference now to FIGS. 12a and 12b, in another embodiment of a system 120 as disclosed herein a current sensing assembly may include a current sense transformer embedded within an SMT three-terminal power switching device 121. A toroidal inductive winding 122 is disposed for magnetic coupling, but nonetheless in galvanic isolation, with respect to one of the legs 12 or 14 on the represented side of the device 121. First and second current sensing leads from the winding 122 are electrically coupled to respective legs 15, 16 which extend from the switching device housing.

Figure 13A:
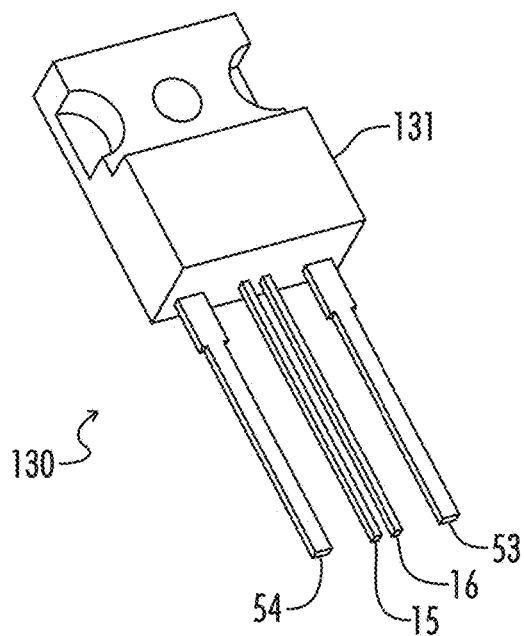
FIG. 13a represents an embodiment of a partially controllable and THT-type switching device having an embedded current sense transformer according to the present invention.
Figure 13B:
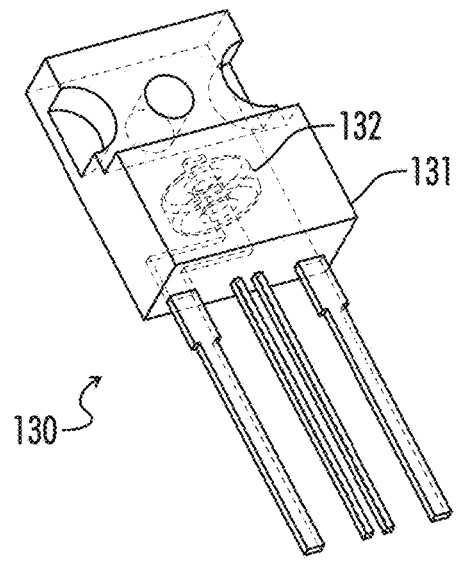

With reference now to FIGS. 13a and 13b, in another embodiment of a system 130 as disclosed herein a current sensing assembly may include a current sense transformer embedded within a partially-controlled (two-terminal) power switching device 131. A toroidal inductive winding 132 is disposed for magnetic coupling, but nonetheless in galvanic isolation, with respect to one of the legs 53 or 53 for the two-terminal device 131. First and second current sensing leads from the winding 112 are electrically coupled to respective legs 15, 16 which extend from the switching device housing in a THT configuration.

Figure 14A:
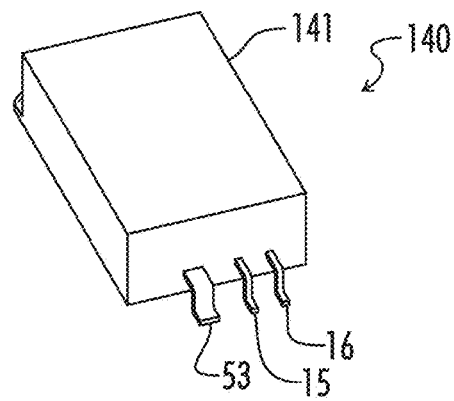
FIG. 14a represents an embodiment of a partially controllable and SMT-type switching device having an embedded current sense transformer according to the present invention.
Figure 14B:
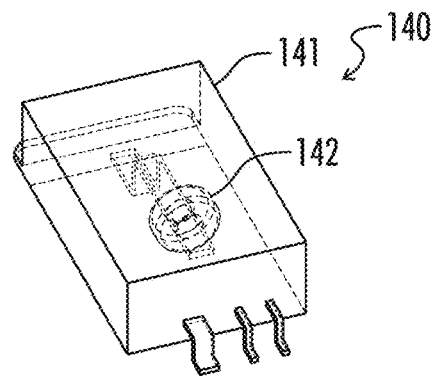

With reference now to FIGS. 14a and 14b, in another embodiment of a system 140 as disclosed herein a current sensing assembly 142 may include a current sense transformer embedded within a partially-controlled (two-terminal) power switching device 141, otherwise equivalent to an embodiment as represented in FIGS. 13a and 13b except that the device 141 is configured for an SMT configuration.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "coupled" means at least either a direct electrical connection between the connected items or an indirect connection through one or more passive or active intermediary devices.

The term "power switching device" and "switch" may be used interchangeably and may refer herein to at least: a variety of transistors as known in the art (including but not limited to FET, BJT, IGBT, JFET, etc.), a switching diode, a silicon controlled rectifier (SCR), a diode for alternating current (DIAC), a triode for alternating current (TRIAC), a mechanical single pole/double pole switch (SPDT), or electrical, solid state or reed relays. Where either a field effect transistor (FET) or a bipolar junction transistor (BJT) may be employed as an embodiment of a transistor, the scope of the terms "gate," "drain," and "source" includes "base," "collector," and "emitter," respectively, and vice-versa.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A current sensing apparatus comprising:
an assembly housing defining at least a first interior cavity having a galvanically insulating tubular sleeve extending therethrough;
a toroidal inductive winding residing within the first cavity and circumferentially disposed about the tubular sleeve;
first and second current sensing terminals electrically connected with respective locations along the inductive winding;
wherein upon a first terminal leg extending through the tubular sleeve, a current flowing through the first terminal leg from a power switching device is detectable via magnetic coupling with the inductive winding; and
a damping inductive element configured to suppress high frequency oscillations on a second leg of the power switching device and disposed within a second interior cavity defined by the assembly housing.

2. The apparatus of claim 1, wherein the first and second current sensing terminals are respectively coupled to first and second current sensing leads extending from the assembly housing.

3. The apparatus of claim 2, wherein the first and second current sensing leads are configured for through-hole coupling to a printed circuit board associated with the power switching device.

4. The apparatus of claim 2, wherein the first and second current sensing leads are configured for surface-mount coupling to a printed circuit board associated with the power switching device.

5. The apparatus of claim 1, wherein the damping inductive element comprises a ferrite bead.

6. The apparatus of claim 5, wherein the damping inductive element comprises an aperture configured to receive a second leg of the power switching device.

7. The apparatus of claim 6, wherein the first leg is associated with a drain terminal or a source terminal of a MOSFET power switching device, and the second leg is associated with a gate terminal of the MOSFET power switching device.

8. The apparatus of claim 6, wherein the first leg and the second leg are respectively associated with either of the anode and cathode terminals of a power diode as the power switching device.

9. A system comprising:
a power switching device comprising a component housing and a plurality of terminal legs extending therefrom;
a current sensor assembly housing defining at least a first interior cavity having a galvanically insulating tubular sleeve extending therethrough;
a toroidal inductive winding residing within the first cavity and circumferentially disposed about the tubular sleeve;
first and second current sensing terminals electrically connected with respective locations along the inductive winding,
wherein upon the first terminal leg of the power switching device extending through the tubular sleeve, a current flowing through the first terminal leg is detectable via magnetic coupling with the inductive winding; and
a damping inductive element configured to suppress high frequency oscillations on a second leg of the power switching device and disposed within a second interior cavity defined by the assembly housing.

10. The system of claim 9, at least a first terminal leg of said terminal legs having an upper portion adjacent the component housing that is wider than a remaining portion extending away from the component housing, and wherein the current sensor assembly housing comprises a top holder configured to be press-fit to the housing by the upper portion of the first terminal leg when engaged therewith.

11. The system of claim 9, wherein the first and second current sensing terminals are respectively coupled to first and second current sensing leads extending from the assembly housing.

12. The system of claim 11, wherein the first and second current sensing leads are configured for through-hole coupling to a printed circuit board associated with the power switching device.

13. The system of claim 11, wherein the first and second current sensing leads are configured for surface-mount coupling to a printed circuit board associated with the power switching device.

14. The system of claim 9, wherein the damping inductive element comprises a ferrite bead.

15. The system of claim 14, wherein the damping inductive element comprises an aperture configured to receive the second leg of the power switching device.

16. The system of claim 15, wherein the first leg is associated with a drain terminal or a source terminal of a MOSFET power switching device, and the second leg is associated with a gate terminal of the MOSFET power switching device.

17. The system of claim 15, wherein the first leg and the second leg are respectively associated with either of the anode and cathode terminals of a power diode as the power switching device.

* * * * *